United States Patent
Hasegawa et al.

(10) Patent No.: US 10,475,621 B2
(45) Date of Patent: Nov. 12, 2019

(54) DRAWING DEVICE AND DRAWING METHOD

(71) Applicant: NUFLARE TECHNOLOGY, INC., Yokohama-shi (JP)

(72) Inventors: Kei Hasegawa, Yokohama (JP); Hayato Kimura, Sunto (JP); Hideo Inoue, Miura (JP); Yoshiaki Onimaru, Yokohama (JP)

(73) Assignee: NUFLARE TECHNOLOGY, INC., Yokohama-shi (JP)

( * ) Notice: Subject to any disclaimer, the term of this patent is extended or adjusted under 35 U.S.C. 154(b) by 0 days.

(21) Appl. No.: 15/991,520

(22) Filed: May 29, 2018

(65) Prior Publication Data

US 2018/0350560 A1 Dec. 6, 2018

(30) Foreign Application Priority Data

May 30, 2017 (JP) ................................. 2017-106588

(51) Int. Cl.
*H01J 37/317* (2006.01)
*G03F 7/20* (2006.01)

(52) U.S. Cl.
CPC ........ *H01J 37/3177* (2013.01); *G03F 7/2059* (2013.01)

(58) Field of Classification Search
CPC ............... H01J 37/3177; H01J 37/3026; H01J 2237/31774; H01J 2237/31776; G03F 7/2059

See application file for complete search history.

(56) References Cited

U.S. PATENT DOCUMENTS

2015/0001417 A1* 1/2015 Morita .................. H01J 37/045
250/396 R

FOREIGN PATENT DOCUMENTS

| JP | 1-169553 | 7/1989 |
| JP | 6-224112 | 8/1994 |
| JP | 6-103474 | 12/1994 |
| JP | 2000-276327 | 10/2000 |
| JP | 2008-176093 | 7/2008 |
| JP | 2009-64238 | 3/2009 |

* cited by examiner

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

A drawing device according to an embodiment includes: a stage configured to be capable of having a processing target mounted thereon; an aperture member including a plurality of apertures corresponding to a plurality of beams irradiated to the processing target; a data generator configured to generate gradation data indicating irradiation time data with n bits (n is a positive integer) with respect to positions of respective coordinates of the beams; a calculator configured to perform a logical addition operation of the gradation data of the respective positions of the coordinates; and a controller configured to control the aperture member based on the gradation data and a result of the logical addition operation.

12 Claims, 8 Drawing Sheets

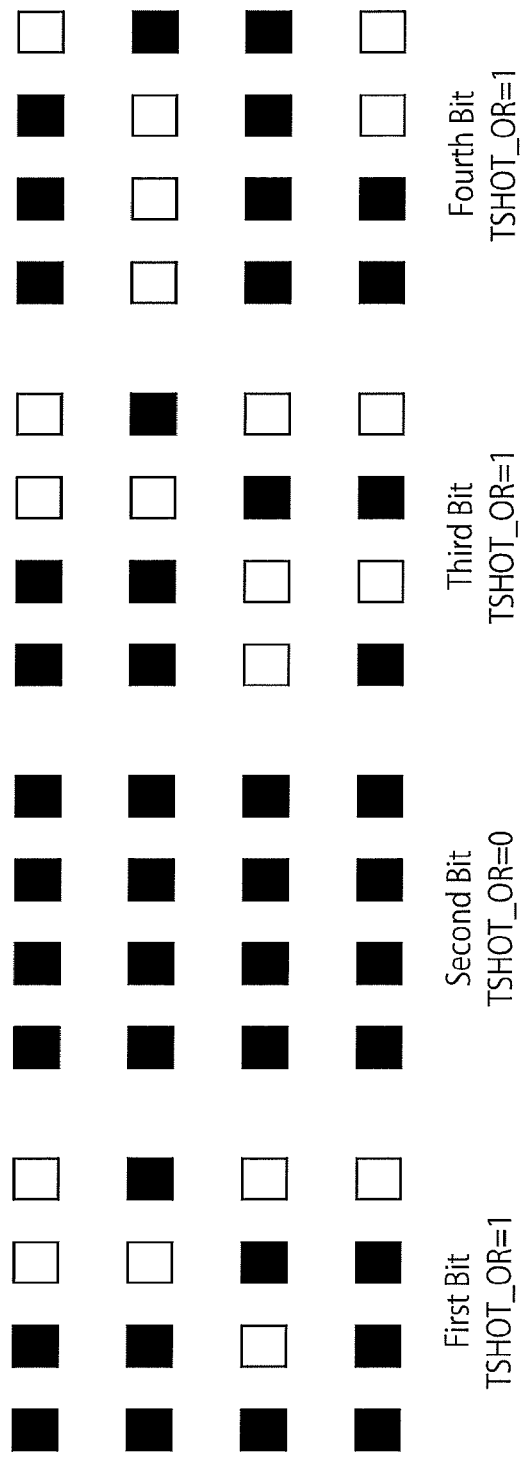

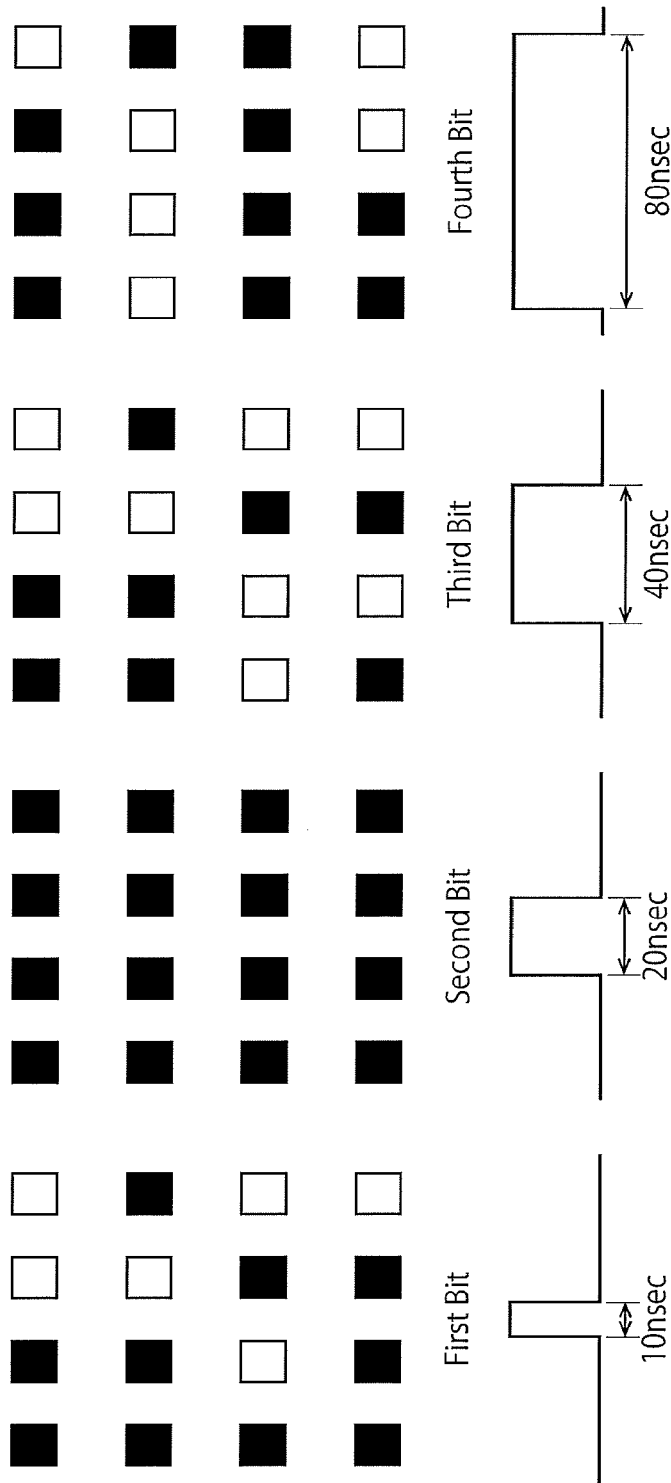

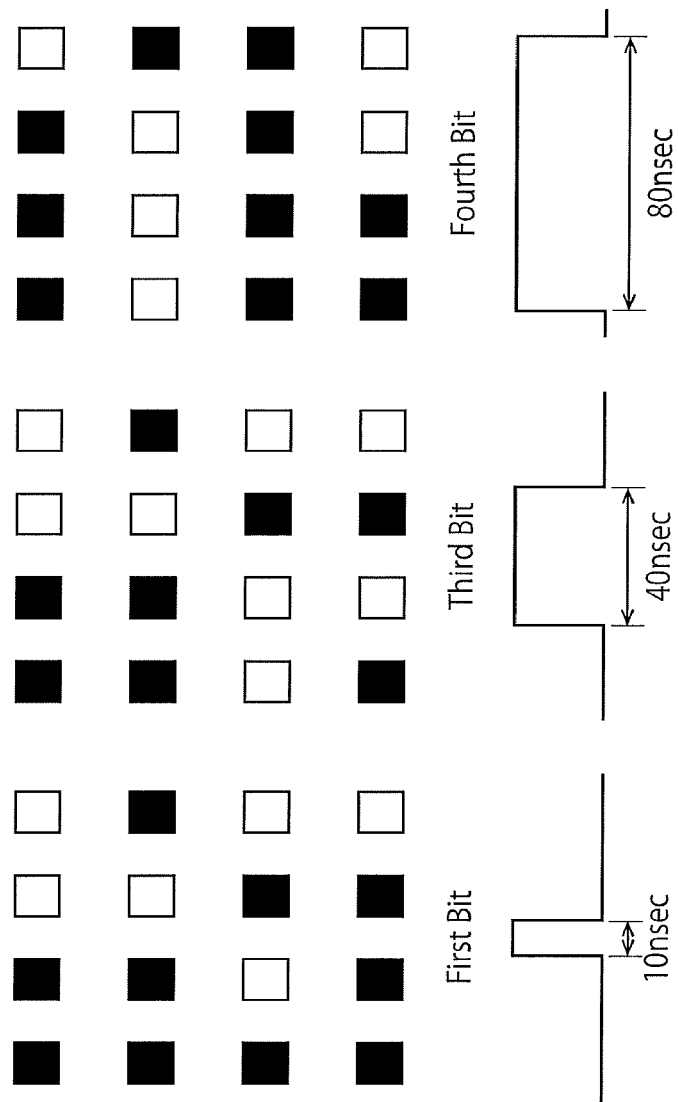

DRAWING DEVICE AND DRAWING METHOD

CROSS REFERENCE TO RELATED APPLICATIONS

This application is based upon and claims the benefit of priority from the prior Japanese Patent Application No. 2017-106588, filed on May 30, 2017, the entire contents of which are incorporated herein by reference.

FIELD

The embodiments of the present invention relate to a drawing device and drawing method.

BACKGROUND

A lithography technique that promotes downscaling of a semiconductor device is an important process of generating a pattern among semiconductor manufacturing processes. In recent years, the circuit line width required for a semiconductor device is downscaled as the density of an LSI (Large-Scale Integration) becomes higher. A photomask used for forming such a downscaled circuit pattern is formed by using an electron-beam drawing technique. In the electron-beam drawing technique, a photomask is formed by irradiating electron beams to a mask blank to draw a mask pattern.

For example, there is a drawing device using multiple beams. A drawing device using multiple beams can irradiate more beams at one time than in a case of drawing with one electron beam and thus can improve the throughput. This type of multibeam drawing device shapes an electron beam emitted from an electron gun into multiple beams by using an aperture array having a plurality of holes, executes blanking control of the multiple beams, and downsizes and deflects beams that have not been shielded, by using an optical system to be irradiated to the mask blank.

The respective amounts of the multiple beams are individually controlled according to irradiation times. In this multibeam drawing device, a reduction in the beam irradiation times is demanded to further improve the throughput.

SUMMARY

A drawing device according to an embodiment includes: a stage configured to be capable of having a processing target mounted thereon; an aperture member including a plurality of apertures corresponding to a plurality of beams irradiated to the processing target; a data generator configured to generate gradation data indicating irradiation time data with n bits (n is a positive integer) with respect to positions of respective coordinates of the beams; a calculator configured to perform a logical addition operation of the n-bit gradation data of the respective positions of the coordinates; and a controller configured to control the aperture member based on the gradation data and a result of the logical addition operation.

A drawing method according to an embodiment includes: generating gradation data indicating irradiation time data with n bits (n is a positive integer) with respect to each of positions of coordinates of a plurality of beams to be irradiated to a processing target through a plurality of apertures provided in an aperture member, in a data generator; performing a logical addition operation of the n-bit gradation data of the respective positions of the coordinates, in a calculator; and controlling the aperture member based on the gradation data and a result of the logical addition operation.

BRIEF DESCRIPTION OF THE DRAWINGS

FIGS. 5A to 5D are conceptual diagrams illustrating states of the apertures at the first to fourth bits of the gradation data;

FIGS. 6A to 6D are conceptual diagrams illustrating irradiation times of the first to fourth bits of the gradation data represented by binary numbers;

FIGS. 7A to 7C are conceptual diagrams illustrating gradation data transferred by the high-speed data transmitter and irradiation times corresponding thereto;

DETAILED DESCRIPTION

Embodiments will now be explained with reference to the accompanying drawings. The present invention is not limited to the embodiments.

First Embodiment

Figure 1:
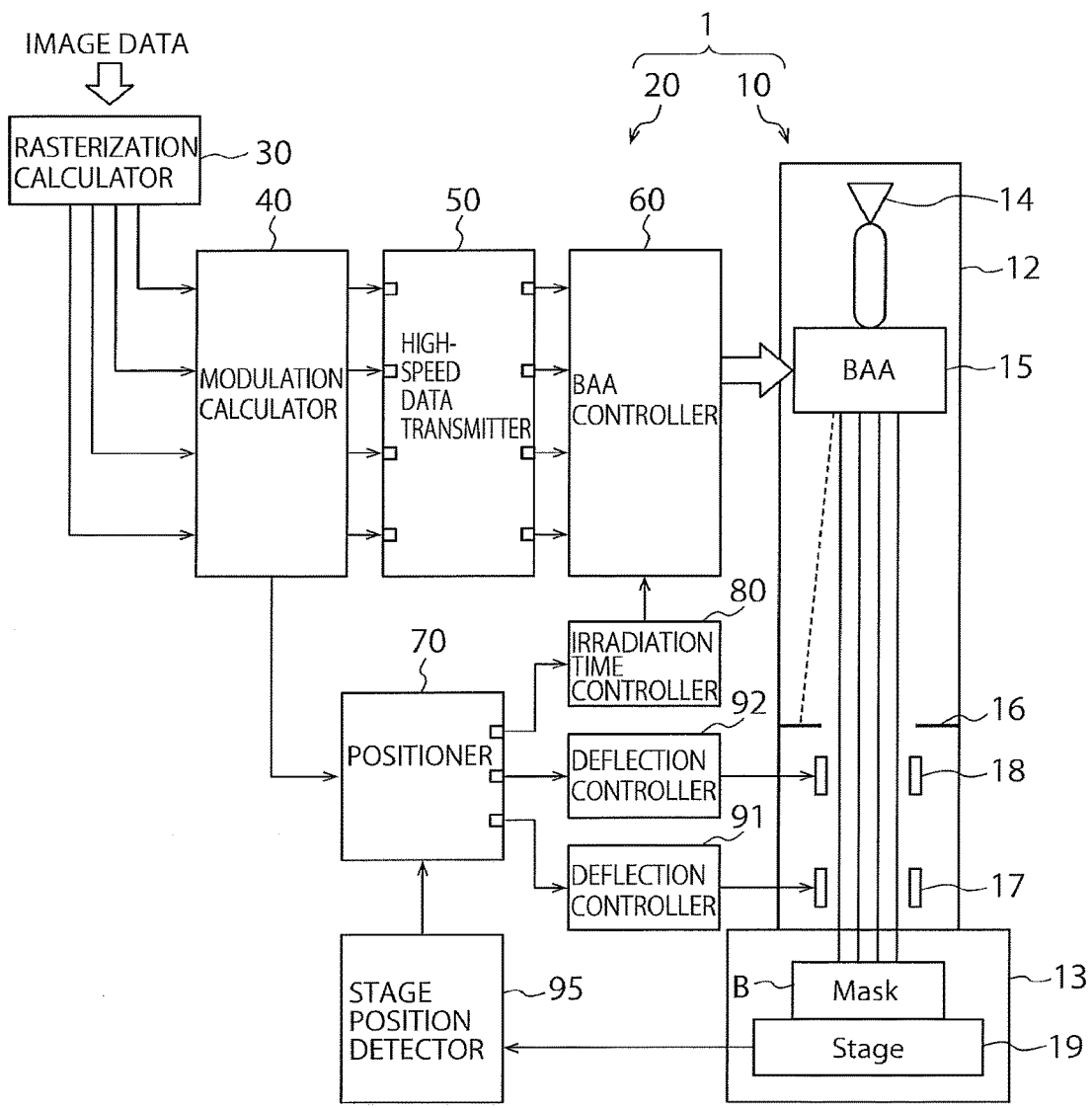
FIG. 1 is a conceptual diagram illustrating an example of a configuration of a drawing device according to a first embodiment.

FIG. 1 is a conceptual diagram illustrating an example of a configuration of a drawing device according to a first embodiment. The drawing device 1 is, for example, a multiple charged particle beam exposure device and is used to draw a lithographic photomask to be used in manufacturing of a semiconductor device. The present embodiment can be applied to a device that irradiates electron beams or light to a processing target, such as an exposure device, an electron microscope, or an optical microscope, as well as the drawing device. Therefore, a sample B being a processing target can be a semiconductor substrate (a silicon wafer) or the like, as well as a mask blank. The following descriptions are made assuming the sample B is a mask blank B. In FIG. 1, while a configuration necessary to explain the first embodiment is described, the drawing device 1 can include other configurations.

The drawing device 1 includes a drawer 10 and a drawing controller 20. The drawer 10 includes an electron column 12 and a drawing chamber 13. The electron column 12 is provided on the top surface of the drawing chamber 13 and shapes a charged particle beam by using an optical system. The electron column 12 deflects the charged particle beam to be irradiated to the mask blank B located in the drawing chamber 13. The drawing chamber 13 has an inner part in a vacuum state (a depressurized state) and houses an XY stage 19 therein. The mask blank B can be mounted on the XY stage 19.

An emitter 14, a blanking aperture array (hereinafter, also BAA) mechanism 15, a restrictor 16, a main deflector 17, and a sub deflector 18 are placed in the electron column 12.

The emitter 14 emits a charged particle beam. The charged particle beam can be a beam such as an electron beam or an ion beam. A shaping aperture array mechanism (not illustrated) including a plurality of apertures shapes the charged particle beam emitted from the emitter 14 into a plurality of charged particle beams (hereinafter, also "multiple beams").

The BAA mechanism 15 being an aperture member includes a plurality of apertures corresponding to the multiple beams, respectively, and determines whether to irradiate each of the multiple beams to the mask blank B. That is, the BAA mechanism 15 executes blanking control (ON/OFF control) of each of the multiple beams. For example, at the time of passage of the multiple beams through the apertures of the BAA mechanism 15 in the blanking control, the BAA mechanism 15 controls the directions of the respective beams to irradiate each beam to either the restrictor 16 or the mask blank B. The ON state is a state in which a beam is irradiated to the mask blank B. When the BAA mechanism 15 sets one beam of the multiple beams to an ON state, the beam passes without being shielded by the restrictor 16 and is irradiated to the mask blank B. On the other hand, the OFF state is a state in which a beam is irradiated to the restrictor 16. When the BAA mechanism 15 sets a beam to an OFF state, the beam is shielded by the restrictor 16 and is not irradiated to the mask blank B. The BAA mechanism 15 electromagnetically controls the directions of respective beams in the multiple beams by using apertures in a blanker and sets the respective beams to either an ON state or an OFF state. This enables the BAA mechanism 15 to individually control the amounts of irradiation (irradiation times) of the respective beams in the multiple beams to the mask blank B.

The main deflector 17 and the sub deflector 18 are provided to control the positions of beam shots to the mask blank B.

The XY stage 19 can have the mask blank B mounted thereon and move the mask blank B within a substantially horizontal plane at the time of drawing.

The drawing controller 20 includes a rasterization calculator 30, a modulation calculator 40, a high-speed data transmitter 50, a BAA controller 60, a positioner 70, an irradiation time controller 80, deflection controllers 91 and 92, and a stage position detector 95. At least part of the drawing controller 20 described in the above embodiments may be implemented in either hardware including a circuitry or software. When implemented in software, a program that realizes at least part of functions of the drawing controller 20 may be stored on a recording medium such as CD-ROM and read and executed by a computer. The recording medium is not limited to a removable recording medium such as a magnetic disk or optical disk, but may be a non-removable recording medium such as a hard disk device or memory.

The rasterization calculator 30 serving as a converter converts layout data, created in advance by a user, into a raster image represented by dots. That is, the rasterization calculator 30 converts image data of a layout, that is to be drawn on the mask blank B, into data of a bitmap format.

The modulation calculator 40 serving as a data generator and a calculator generates gradation data corresponding to each of the apertures of the BAA mechanism 15 based on the bitmap data. That is, the modulation calculator 40 generates gradation data corresponding to coordinates of each of the multiple beams passing through the apertures. At this time, the modulation calculator 40 generates the gradation data considering the sensitivity of a photoresist coated on the mask blank B, the distortion of the BAA mechanism 15, and the like.

The gradation data is binary data representing irradiation time data of each of the multiple beams passing through the apertures with n bits (n is a positive integer). Each of the bits of the gradation data corresponds to a predetermined irradiation time and a total irradiation time obtained by adding the irradiation times of the n bits is an irradiation time of one shot. Therefore, one piece of gradation data indicates the beam amount of one shot irradiated to a predetermined portion on the mask blank B.

The modulation calculator 40 further performs a logical addition operation (an OR operation) of the n-bit gradation data of the respective apertures of the BAA mechanism 15. The gradation data, and the logical addition operation is described later with reference to FIGS. 4A to 4E.

The high-speed data transmitter 50 transfers the gradation data of each of the apertures of the BAA mechanism 15 to the BAA controller 60 with respect to each bit. At this time, the high-speed data transmitter 50 determines whether to transfer the bits of the gradation data based on result data of the OR operation described above. For example, when result data of a kth ($1 \leq k \leq n$) bit of the gradation data indicates that the charged particle beam is shielded in the apertures, the high-speed data transmitter 50 omits to transfer the kth bit.

The BAA controller 60 serving as a controller controls the BAA mechanism 15 according to the bits of the gradation data of each of the apertures transferred from the high-speed data transmitter 50. At this time, the BAA controller 60 controls the BAA mechanism 15 according to the bits transferred from the high-speed transmitter 50.

The positioner 70 receives coordinate data of each aperture, the irradiation time of each bit of the gradation data, and the result data of the OR operations from the modulation calculator 40. The positioner 70 controls the deflection controllers 91 and 92 based on the coordinate data of each aperture. The deflection controllers 91 and 92 control the main deflector 17 and the sub deflector 18 to irradiate each of the multiple beams having passed through the BAA mechanism 15 to a predetermined position on the mask blank B. For example, when drawing on the mask blank B is to be performed, the drawing device 1 moves the XY stage 19 in one direction within a horizontal plane. At this time, the main deflector 17 positions the multiple beams in a sub region on the mask blank B and the sub deflector 18 irradiates the multiple beams to predetermined positions in the sub region.

The irradiation time controller 80 transfers the irradiation time corresponding to each bit of the gradation data to the BAA controller 60. For example, when the BAA controller 60 controls the BAA mechanism 15 based on each bit of the gradation data, the irradiation time controller 80 transfers the irradiation time indicated by the bit to the BAA controller 60. The BAA controller 60 controls each aperture of the BAA mechanism 15 according to the gradation data and the irradiation time corresponding to each bit.

The drawing controller 20 having the configuration described above can be constituted by one computer or CPU, or can be constituted by a plurality of computers or CPUs. For example, the rasterization calculator 30, the modulation calculator 40, the high-speed data transmitter 50, the BAA controller 60, the positioner 70, the irradiation time controller 80, the deflectors 17 and 18, and the stage position detector 95 can be constituted by different computers or CPUs, respectively. Any two or more of these elements can be constituted by one computer or CPU.

A part of the configuration of the drawing controller 20 can be placed outside the drawing device 1. For example, one or both of the rasterization calculator 30 and the modulation calculator 40 can be provided outside the drawing device 1. When the rasterization calculator 30 is provided outside, the drawing device 1 receives the bitmap data from outside. When the modulation calculator 40 is provided outside, the drawing device 1 receives the gradation data and the result data of the OR operations from outside.

Although not illustrated, the respective elements of the drawing controller 20 can include, for example, a memory that has stored therein data such as the gradation data, the result data, the irradiation time, the coordinate data, or data in the middle of an operation.

An operation of the drawing device 1 according to the present embodiment is described next.

Figure 2:
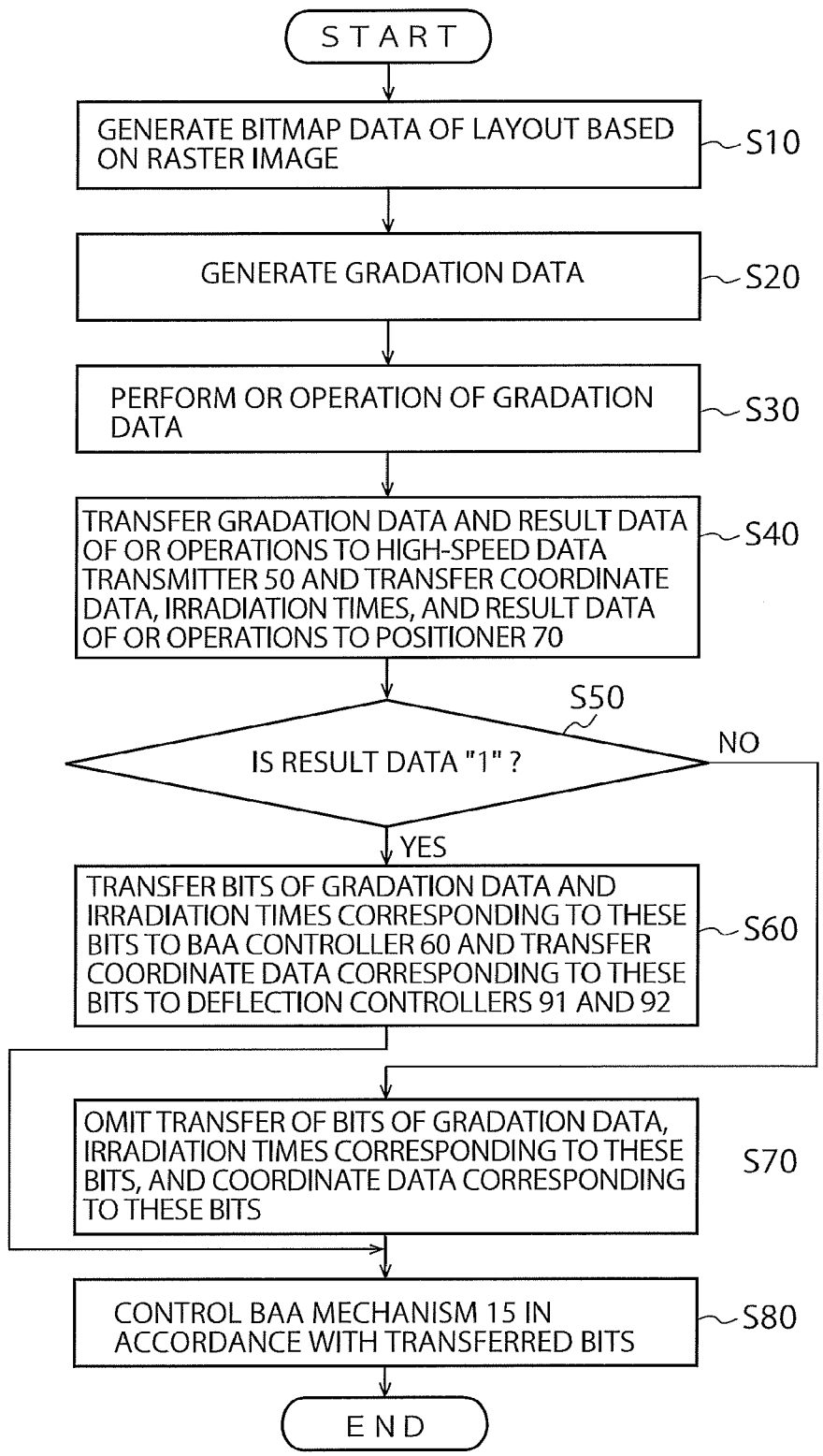
FIG. 2 is a flowchart illustrating an example of the operation of the drawing device 1 according to the first embodiment.
Figure 3A:
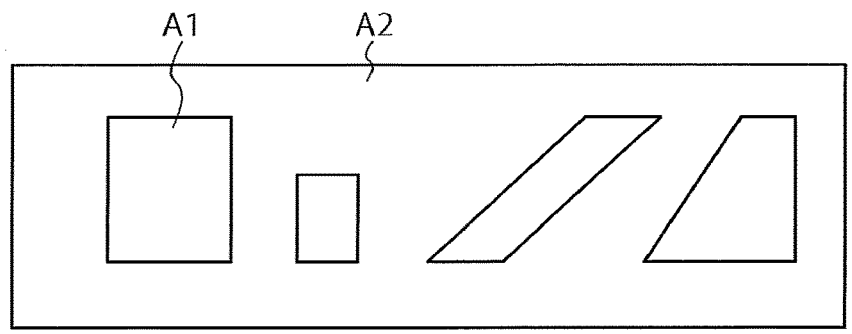
FIGS. 3A to 3D are conceptual diagrams illustrating an example of processing of layout data in the drawing controller.

FIG. 2 is a flowchart illustrating an example of the operation of the drawing device 1 according to the first embodiment. FIGS. 3A to 3D are conceptual diagrams illustrating an example of processing of layout data in the drawing controller 20. FIGS. 3A to 3D schematically illustrate the processing of layout data for easy understanding and may be different from actual processing. FIG. 3A illustrates image data of a layout. An area A1 indicates an irradiation region of charged particle beams and an area A2 indicates a region to which the charged particle beams are not irradiated.

Figure 3B:
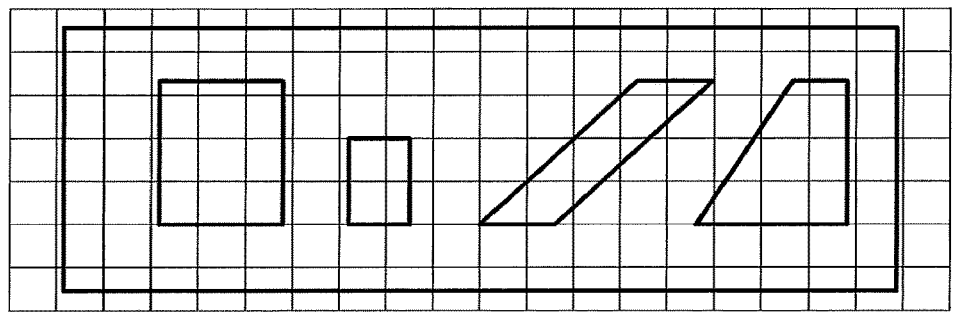
Figure 3C:
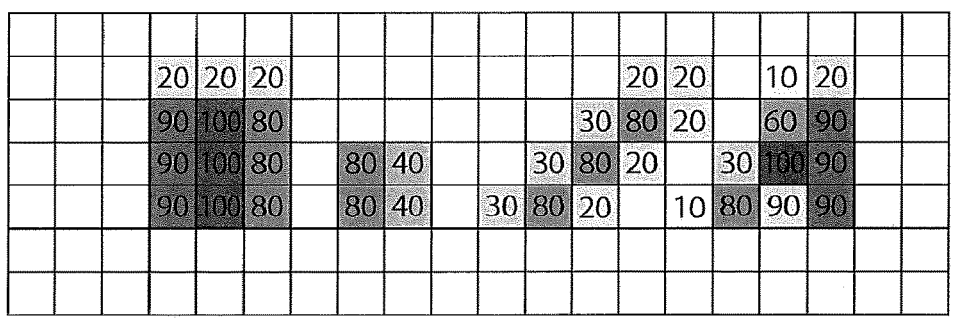

First, the rasterization calculator 30 sectionalizes the image data of FIG. 3A to correspond to each of the apertures of the BAA mechanism 15. For example, the rasterization calculator 30 sectionalizes the image data into 10 nm meshes as illustrated in FIG. 3B. The rasterization calculator 30 generates bitmap data of the layout based on the sectionalized raster image as illustrated in FIG. 3C (Step S10). The bitmap data is represented by brightness or the like in each section of FIG. 3B according to the ratio of a beam irradiation region calculated for each section. For example, in FIG. 3C, a section to which charged particle beams are entirely irradiated is represented by 100% and a section to which no charged particle beams are irradiated is represented by 0%. A section to which the charged particle beams are partially irradiated is represented by a ratio between 0% to 100% according to the ratio of a region to which the beams are irradiated.

Figure 3D:
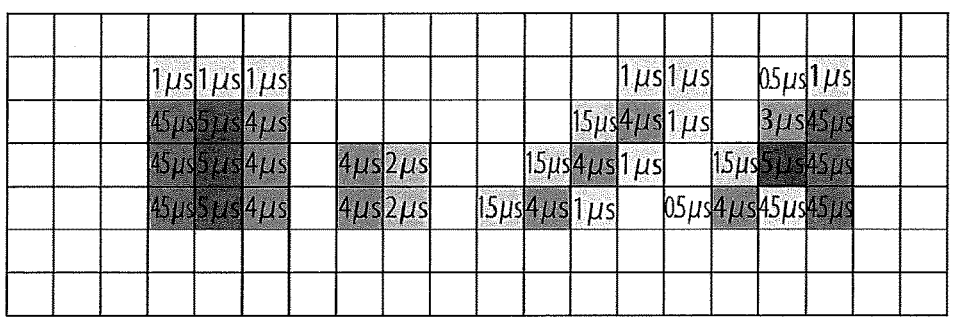

Next, as illustrated in FIG. 3D, an irradiation time of each of the multiple beams corresponding to the bitmap data is generated to generate gradation data (Step S20). Practically, the gradation data is data of the irradiation time of each of the multiple beams represented by n bits, described with reference to FIG. 4A.

Figures 4A, 4B, 4C, 4D, 4E:
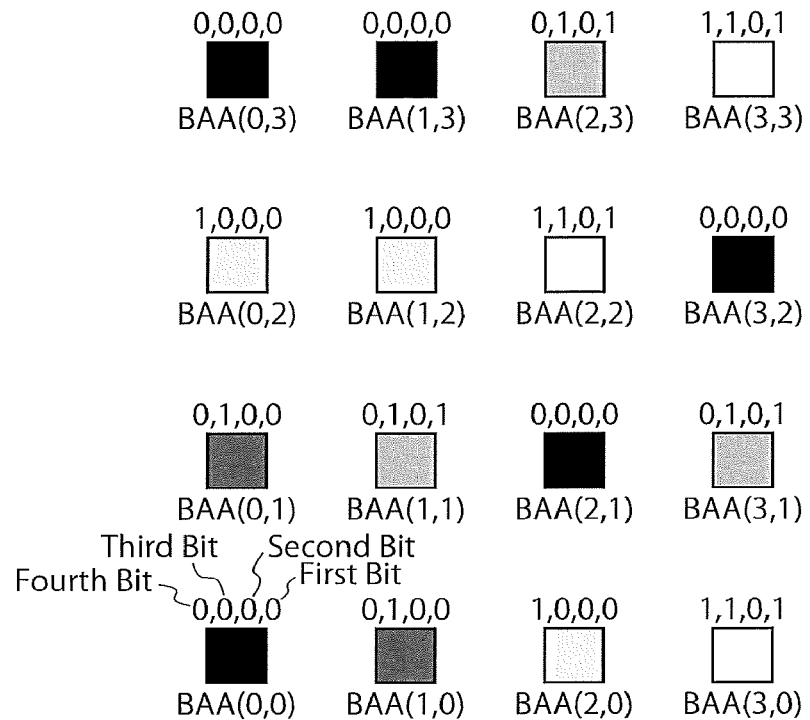
FIG. 4A is a conceptual diagram illustrating an example of gradation data of four bits.
FIGS. 4B to 4E are diagrams illustrating the gradation data.

FIG. 4A is a conceptual diagram illustrating an example of gradation data of four bits. FIG. 4A illustrates gradation data for the sake of convenience and does not necessarily correspond to FIG. 3D. In FIG. 4A, each of the apertures of the BAA mechanism 15 is represented by a rectangular frame and the beam irradiation time in each aperture is represented by brightness in the frame of each aperture. The coordinates (x, y) of each aperture are indicated under the aperture. The coordinates (x, y) correspond to the coordinates of each of the multiple beams shaped by each aperture of the BAA mechanism 15. The gradation data of each aperture is represented by a binary number above the aperture. For example, the gradation data is represented by 4-bit data in each position of coordinates (x, y).

Each bit data of the gradation data indicates whether to irradiate the charged particle beam passing through the corresponding aperture to the mask blank B. For example, when bit data of the gradation data of a certain aperture is "1", the charged particle beam passing through the aperture is irradiated by the BAA mechanism 15 to the mask blank B. That is, "1" indicates an ON state. When the bit data is "0", the BAA mechanism 15 prevents the charged particle beam passing through the aperture from being irradiated to the mask blank B. That is, "0" indicates an OFF state.

First to fourth bits of the gradation data in each position of the coordinates (x, y) correspond to different beam irradiation times, respectively, and a combination of the first to fourth bits indicates a desired beam irradiation time. A relation between the first to fourth bits of the gradation data and the beam irradiation times corresponding thereto is described with reference to FIGS. 6A to 6D.

The modulation calculator 40 performs a logical addition operation (an OR operation) of the gradation data of the respective apertures in the BAA mechanism 15 (Step S30). FIGS. 4B to 4E are diagrams illustrating each bit of the gradation data. Data of respective bits in FIGS. 4B to 4E are shown in positions corresponding to the coordinates in FIG. 4A. FIG. 4B illustrates data of the first bit. FIG. 4C illustrates data of the second bit. FIG. 4D illustrates data of the third bit. FIG. 4E illustrates data of the fourth bit.

The modulation calculator 40 further performs an OR operation of the gradation data of the n bits. As a result, as illustrated in FIGS. 4A and 4B, the first bits of the gradation data in coordinates (3, 0), (1, 1), (3, 1), (2, 2), (2, 3), and (3, 3) are "1" and thus result data of the OR operation is "1", the second bits are second logic "0" in all the coordinates. Therefore, result data of the OR operation of the data of the second bit is "0". Meanwhile, result data of OR operations of the third and fourth bits are "1" as well as the data of the first bit. That is, the result data of the OR operations of the n-bit gradation data are "1", "0", "1", and "1".

The result data "1" indicates that beams having passed through some apertures in the BAA mechanism 15 are in an ON state and are irradiated to the mask blank B. Meanwhile, the result data "0" indicates that all beams having passed through the apertures in the BAA mechanism 15 are in an OFF state and are not irradiated to the mask blank B.

Next, the modulation calculator 40 transfers the gradation data and the result data of the OR operations to the high-speed data transmitter 50. Along therewith, the modulation calculator 40 transfers the coordinate data of the apertures corresponding to the gradation data, the irradiation times corresponding to the respective bits of the gradation data, and the result data of the OR operations to the positioner 70 (Step S40).

(Transfer of Gradation Data: High-Speed Data Transmitter 50, BAA Controller 60)

Next, the high-speed data transmitter 50 determines whether to transfer data of bits of the gradation data based on the result data of the OR operations described above (Step S50). When the data of a kth (1≤k≤n) bit of the gradation data is in an OFF state in all the apertures, the high-speed data transmitter 50 does not perform data transfer of the kth bit. An operation of the high-speed data transmitter 50 is described with reference to FIGS. 5A to 5D.

FIGS. 5A to 5D are conceptual diagrams illustrating states of the apertures at the first to fourth bits of the gradation data. FIG. 5A illustrates a state of the apertures of the BAA mechanism 15 at the first bit. FIG. 5B illustrates a state of the apertures of the BAA mechanism 15 at the second bit. FIG. 5C illustrates a state of the apertures of the BAA mechanism 15 at the third bit. FIG. 5D illustrates a state of the apertures of the BAA mechanism 15 at the fourth bit. Apertures indicated in black shield beams without irradiating the beams to the mask blank B (the OFF state). Apertures indicated in white irradiate beams to the mask blank B (the ON state).

TSHOT_OR indicates result data of the OR operation. In the examples of FIGS. 5A to 5D, result data TSHOT_OR of the first, third, and fourth bits are "1" and result data TSHOT_OR of the second bit is "0". When the result data TSHOT_OR is "1" as in the first, third, and fourth bits (YES at Step S50), the high-speed data transmitter 50 transfers the gradation data of the first, third, and fourth bits to the BAA controller 60 (Step S60). On the other hand, when the result data TSHOT_OR is the second logic "0" as in the second bit (NO at Step S50), the high-speed data transmitter 50 does not transfer the second bit data (Step S70).

In this manner, the high-speed data transmitter 50 skips the data of the second bit being in an OFF state in all the apertures of the BAA mechanism 15 without transferring the data to the BAA controller 60. That is, the high-speed data transmitter 50 transfers the data of the first bits of the respective apertures of the BAA mechanism 15 to the BAA controller 60 and then transfers the data of the third bits to the BAA controller 60. Due to not transferring the data of the second bits, the beam irradiation time related to the second bits becomes unnecessary and the entire beam irradiation time of the gradation time (the sum of the irradiation time to the mask blank B and the irradiation time to the restrictor 16) is reduced.

(Transfer of Irradiation Time: Irradiation Time Controller 80).

Meanwhile, the positioner 70 transfers the data of the respective bits of the gradation data to the irradiation time controller 80 after Step S40.

FIGS. 6A to 6D are conceptual diagrams illustrating irradiation times of the first to fourth bits of the gradation data represented by binary numbers. As described above, the first to fourth bits of the gradation data indicate the beam irradiation times, respectively. FIG. 6A illustrates the first bit data corresponding to each aperture and the irradiation time. FIG. 6B illustrates the second bit data corresponding to each aperture and the irradiation time. FIG. 6C illustrates the third bit data corresponding to each aperture and the irradiation time. FIG. 6D illustrates the fourth bit data corresponding to each aperture and the irradiation time. For example, when the first bit data (that is, the least significant bit data) is "1", the BAA mechanism 15 brings the beams to an ON state for 10 nanoseconds. When the second bit data is "1", the beams are brought to an ON state for 20 nanoseconds. When the third bit data is "1", the beams are brought to an ON state for 40 nanoseconds. When the fourth bit data is "1", the beams are brought to an ON state for 80 nanoseconds. The gradation data enables the beams to be brought to an ON state for various irradiation times by combining these plural irradiation times. The irradiation time indicated by each bit of the gradation data is not particularly limited and can be arbitrarily set.

For example, the gradation data in positions of coordinates (0, 0), (2, 1), (3, 2), (0, 3), and (1, 3) of the apertures in FIG. 4A are 0, 0, 0, 0. In this case, apertures corresponding to these positions of coordinates bring the beams to an OFF state when processing any of the first to fourth bits. The gradation data in positions of coordinates (1, 0) and (0, 1) are 0, 1, 0, 0. In this case, apertures corresponding to these positions of coordinates bring the beams to an ON state when processing the third bit and bring the beams to an OFF state when processing the first, second, and fourth bits. Therefore, the apertures corresponding to the positions of the coordinates (1, 0) and (0, 1) irradiate the beams to the mask blank B for 40 nanoseconds. Similarly, the gradation data in positions of coordinates (1, 1), (3, 1), and (2, 3) are 0, 1, 0, 1. In this case, apertures corresponding to these positions of coordinates irradiate the beams to the mask blank B for 50 nanoseconds (10+40 nanoseconds). The gradation data in positions of coordinates (0, 2) and (1, 2) are 1, 0, 0, 0. In this case, apertures corresponding to these positions of coordinates irradiate the beams to the mask blank B for 80 nanoseconds. The gradation data in positions of coordinates (3, 0), (2, 2), and (3, 3) are 1, 1, 0, 1. In this case, apertures corresponding to these positions of coordinates irradiate beams to the mask blank B for 130 nanoseconds (10+20+80 nanoseconds). Due to thus combining the irradiation times corresponding to respective bit data of the gradation data, the beams can be irradiated to the mask blank B for various irradiation times.

The irradiation time controller 80 receives the irradiation times respectively corresponding to the first to fourth bits of the gradation data from the positioner 70 and transfers the received irradiation times to the BAA controller 60. For example, when the BAA controller 60 controls the BAA mechanism 15 based on the respective bit data of the gradation data, the irradiation time controller 80 transfers the irradiation times corresponding to the respective bits to the BAA controller 60. The BAA controller 60 controls respective apertures of the BAA mechanism 15 in accordance with the gradation data and the irradiation times corresponding to the respective bits.

For example, when the result data TSHOT_OR is "1" (Step S50), the irradiation time controller 80 transfers respective positioning coordinate data of the apertures and the irradiation time data corresponding to the first, third, and fourth bits to the BAA controller 60 (Step S60). Meanwhile, when the result data TSHOT_OR is "0", the irradiation time controller 80 does not transfer the irradiation time of the second bits (Step S70). The irradiation time data of the second bits being in an OFF state in all the apertures in the BAA mechanism 15 is thus not transferred to the BAA controller 60. That is, after transferring the irradiation time corresponding to the first bits of the respective apertures in the BAA mechanism 15 to the BAA controller 60, the irradiation time controller 80 transfers the irradiation time corresponding to the third bits to the BAA controller 60. As described above, because the second bits are not transferred by the high-speed data transmitter 50, the irradiation time corresponding to the second bits illustrated in FIG. 6B is reduced.

(Control Based on Coordinate Data: Deflection Controllers 91 and 92)

The deflection controllers 91 and 92 control the main deflector 17 and the sub deflector 18 in accordance with the coordinate data corresponding to each of the first to fourth bits of the gradation data.

Here, when the result data TSHOT_OR is "1" (Step S50), the deflection controllers 91 and 92 control the deflectors 17 and 18 in accordance with the coordinate data of the first, third, and fourth bits (Step S60). Meanwhile, when the result data TSHOT_OR is "0", the deflection controllers 91 and 92 omit control in accordance with the coordinate data of the second bits (Step S70). In this manner, the deflection controllers 91 and 92 skip the control in accordance with the coordinate data with respect to the second bits that are in an OFF state in all the apertures of the BAA mechanism 15. That is, after controlling the deflectors 17 and 18 in accordance with the coordinate data corresponding to the first bits of the respective apertures in the BAA mechanism 15, the deflection controllers 91 and 92 ignore the coordinate data corresponding to the second bits and control the deflectors 17 and 18 in accordance with the coordinate data corresponding to the third bits. As described above, transfer of the second bits is omitted in the high-speed data transmitter 50. Accordingly, due to not transferring the coordinate data corresponding to the second bits, the beam irradiation time is appropriately reduced and the throughput is improved.

Subsequently, the BAA controller 60 controls the BAA mechanism 15 in accordance with the bit data transferred from the high-speed data transmitter 50 (Step S80).

In the present embodiment, the irradiation time controller 80 determines whether to transfer or omit transfer of the irradiation time, and the deflection controllers 91 and 92 determine whether to control the beams based on the coordinate data. However, the positioner 70 alternatively can determine whether to transfer or omit transfer of the irradiation time and the coordinate data based on the result data.

FIGS. 7A to 7C are conceptual diagrams illustrating gradation data transferred by the high-speed data transmitter 50 and irradiation times corresponding thereto. According to the present embodiment, because the coordinate data corresponding to the second bits is not transferred, it suffices that the drawing device 1 executes the first, third, and fourth bits of the gradation data. Therefore, the entire beam irradiation time of the gradation data is reduced and the throughput can be improved.

The gradation data includes n-bit data for each of the apertures of the BAA mechanism 15 and thus the data amount is considerably large. If the modulation calculator 40 intends to process such a large amount of gradation data, load on the modulation calculator 40 becomes large.

In contrast, the high-speed data transmitter 50 determines that respective bit data of the gradation data are not to be transferred based on the result data of the OR operation in the drawing device 1 according to the present embodiment. Therefore, the modulation calculator 40 only needs to perform the OR operation of data for each bit in addition to generation of the gradation data, the irradiation time, and the coordinate data. The OR operation of data for each bit is relatively simple so the load on the modulation calculator 40 is not increased so much. Therefore, the drawing device 1 according to the present embodiment can reduce the overall beam irradiation time without increasing the load on the modulation calculator 40.

The data amount of the irradiation time and the coordinate data corresponding to each bit of the gradation data is relatively small. Therefore, the irradiation time and the coordinate data of each bit of the gradation data can be processed by the modulation calculator 40. That is, when the result data of an OR operation is "0", the modulation calculator 40 can perform processing of deleting the irradiation time and the coordinate data corresponding thereto.

Second Embodiment

In the first embodiment, the high-speed data transmitter 50 determines whether to transfer bits of the gradation data based on the result data of the OR operation. In contrast thereto, the BAA controller 60 determines whether to execute bits of the gradation data based on the result data of the OR operation in a second embodiment. That is, the BAA controller 60 executes or omits control of the BAA mechanism 15 in accordance with the bits of the gradation data based on the result data.

In this case, the high-speed data transmitter 50 can transfer all the bits of the gradation data to the BAA controller 60 regardless of the result data of the OR operations. The irradiation time controller 80 also can transfer the irradiation times corresponding to all the bits of the gradation data to the BAA controller 60 regardless of the result data of the OR operations.

When the result data of a kth bit of the gradation data indicates that charged particle beams are shielded in the apertures, the BAA controller 60 omits control of the BAA mechanism 15 according to the kth bit.

Figures 8, 9:
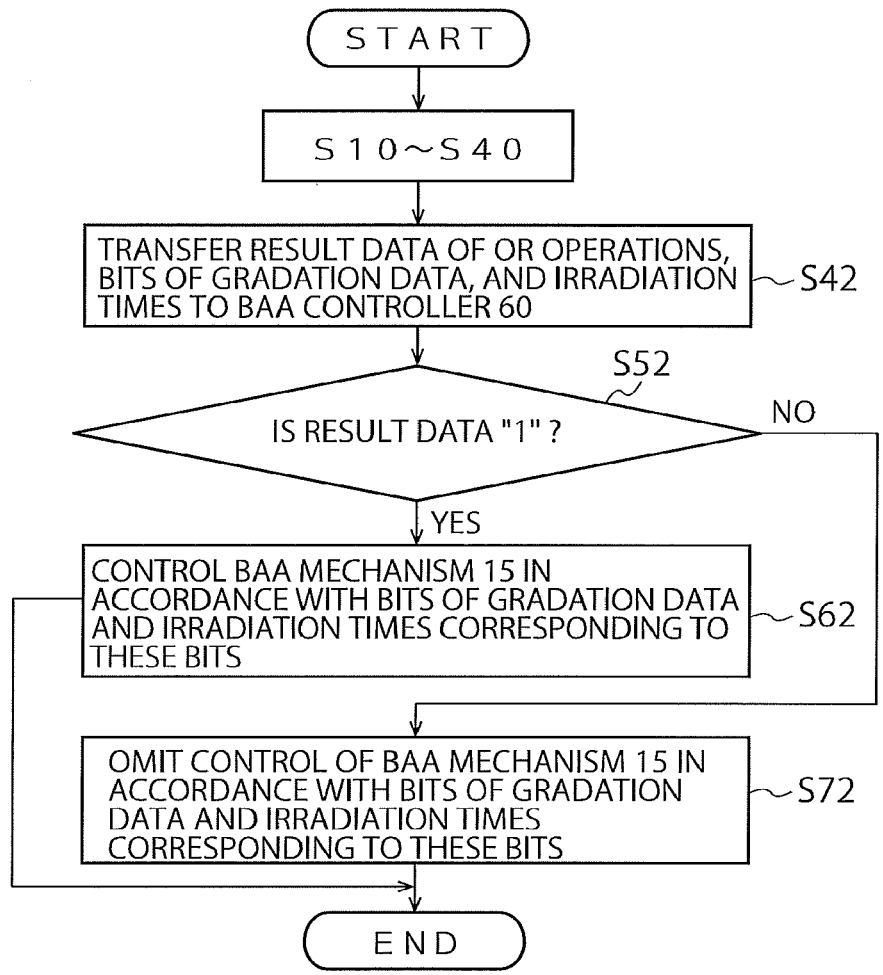
FIG. 8 is a flowchart illustrating an example of an operation of the drawing device according to the second embodiment.
FIG. 9 is a diagram illustrating plural pieces of gradation data D1 to D6.

FIG. 8 is a flowchart illustrating an example of an operation of the drawing device 1 according to the second embodiment.

First, processes at Steps S10 to S40 illustrated in FIG. 2 are performed similarly to the first embodiment.

Next, the high-speed data transmitter 50 transfers the result data of the OR operations described above and bits of the gradation data to the BAA controller 60, and the irradiation time controller 80 transfers the irradiation times to the BAA controller 60 (Step S42). At this time, the high-speed data transmitter 50 does not determine whether to transfer each of the bits of the gradation data. The irradiation time controller 80 also does not determine whether to transfer the irradiation time corresponding to each of the bits of the gradation data.

Next, the BAA controller 60 determines whether to execute control of the BAA controller 15 in accordance with a bit of the gradation data and the irradiation time corresponding to the bit based on the result data of the OR operation (Step S52). When the result data of a kth bit of the gradation data indicates that the charged particle beams are shielded in the apertures, the BAA controller 60 omits the control of the BAA mechanism 15 in accordance with the kth bit.

For example, in the examples of FIGS. 5A to 5D, when the result data TSHOT_OR is "1" as in the first, third, and fourth bits (YES at Step S52), the BAA controller 60 controls the BAA mechanism 15 in accordance with the first, third, and fourth bits and the irradiation times corresponding to these bits (Step S62). Meanwhile, when the result data TSHOT_OR is "0" as in the second bit, the BAA controller 60 omits control of the BAA mechanism 15 in accordance with the second bit and the irradiation time corresponding to the second bit (Step S72).

In this manner, the BAA controller 60 does not execute the control of the BAA mechanism 15 with respect to the second bit being in an OFF state in all the apertures of the BAA mechanism 15 and skips the control. That is, the BAA controller 60 controls the apertures of the BAA mechanism 15 in accordance with the first bit, then ignores the second bit, and executes control in accordance with the third bit.

At this time, the operation of the positioner 70 can be identical to that in the first embodiment. Therefore, in the second embodiment, the second bit and the irradiation time corresponding to the second bit can be reduced similarly to the first embodiment. Thus, the second embodiment can obtain effects identical to the first embodiment.

Third Embodiment

In the first and second embodiments, the modulation calculator 40 performs the OR operation of the gradation data. In contrast thereto, in the third embodiment, the modulation calculator 40 obtains a maximum value (maximum gradation data) in the gradation data of the apertures and specifies bits "0" in a higher order than the most significant bit. The high-speed data transmitter 50 omits transfer of data of the bits "0" in the higher order than the most significant bit with respect to the gradation data of respective coordinates of the apertures. In other words, the high-speed data transmitter 50 specifies a kth ($1 \leq k \leq n$) bit where the data is not "0" and is the most significant bit in the gradation data with respect to each position of the coordinates of the apertures. The high-speed data transmitter 50 then specifies the kth bit not being "0" and being the most significant bit and transfers lower-order bit data than a (k−1)th bit in an identical manner to the first embodiment. At this time, the transfer operation of the gradation data and the omission operation of transfer of the gradation data by the high-speed data transmitter 50 can be identical to those according to the first embodiment.

For example, FIG. 9 is a diagram illustrating plural pieces of gradation data D1 to D6. In the third embodiment, the gradation data is 10-bit data for the sake of convenience. Maximum gradation data among the gradation data D1 to D6 is D5. The most signification bit "1" among first to tenth bits of the maximum gradation data D5 is an eighth bit denoted by TSHOT_MAX. Bits "0" in higher orders than the most significant bit TSHOT_MAX are ninth and tenth bits denoted by S. The modulation calculator 40 thus specifies the eighth bit as the most significant bit TSHOT_MAX and specifies the ninth and tenth bits as the bits S.

The high-speed data transmitter 50 transfers the first to eighth bits (the most significant bit TSHOT_MAX and lower-order bits) in lower orders than the bits S to the BAA controller 60 and does not transfer the ninth and tenth bits specified as the bits S. The transfer operation of the gradation data and the omission operation of transfer of the gradation data by the high-speed data transmitter 50 can be identical to those according to the first embodiment.

Alternatively, the BAA controller 60 controls the BAA mechanism 15 in accordance with the first to eighth bits in the lower orders than the bits S and omits control of the BAA mechanism 15 in accordance with the ninth and tenth bits specified as the bits S. A control operation for the BAA mechanism 15 in accordance with the gradation data and an operation of omitting the control by the BAA controller 60 can be identical to those according to the second embodiment.

Irradiation times of high-order bits thus specified as the bits S are normally set to be longer than irradiation times of other low-order bits. Therefore, omission of the bits S can greatly reduce the entire beam irradiation time of the gradation data. The third embodiment can further obtain the effects according to the first and second embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A drawing device comprising:
a stage configured to be capable of having a processing target mounted thereon;
an aperture member including a plurality of apertures corresponding to a plurality of beams irradiated to the processing target;
a data generator configured to generate gradation data indicating irradiation time data with n bits (n is a positive integer) with respect to positions of respective coordinates of the beams;
a calculator configured to perform a logical addition operation of the gradation data of the respective positions of the coordinates; and
a controller configured to control the aperture member based on the gradation data and a result of the logical addition operation.

2. The device of claim 1, comprising a data transmitter configured to transfer the gradation data of each of the positions of the coordinates to the controller, wherein
the data transmitter transfers data of each of the bits where a result of the logical addition operation is not 0 (zero) in the gradation data to the controller.

3. The device of claim 1, wherein the calculator specifies a kth ($1 \leq k \leq n$) bit not having data of 0 (zero) and being a most significant bit in the gradation data of each of the positions of the coordinates, and the calculator performs the logical addition operation of the kth bit and of lower-order bits of the gradation data, respectively.

4. The device of claim 1, comprising a data transmitter configured to transfer the gradation data of each of the positions of the coordinates to the controller, wherein
the data transmitter omits transfer of a kth ($1 \leq k \leq n$) bit of the gradation data when the kth bit indicates that the charged particle beams are shielded in the apertures.

5. The device of claim 1, comprising a data transmitter configured to transfer the gradation data of each of the positions of the coordinates to the controller, wherein
the controller omits control of the aperture member in accordance with a kth ($1 \leq k \leq n$) bit of the gradation data when the kth bit indicates that the charged particle beams are shielded in the apertures.

6. The device of claim 1, comprising a data transmitter configured to transfer the gradation data of each of the positions of the coordinates to the controller, wherein
the calculator performs a logical addition operation of bits of the apertures with respect to each of first to nth bits of the gradation data, and
the data transmitter transfers bits of the gradation data where a result of the logical addition operation is first logic, and does not transfer bits of the gradation data where a result of the logical addition operation is second logic.

7. The device of claim 1, comprising a data transmitter configured to transfer the gradation data of each of the positions of the coordinates to the controller, wherein
the calculator performs a logical addition operation of bits of the apertures with respect to each of first to nth bits of the gradation data, and
the controller controls the aperture member in accordance with bits of the gradation data where a result of the logical addition operation is first logic, and omits control of the aperture member in accordance with bits of the gradation data where a result of the logical addition operation is second logic.

8. A drawing method comprising:
generating gradation data indicating irradiation time data with n bits (n is a positive integer) with respect to each of positions of coordinates of a plurality of beams to be irradiated to a processing target through a plurality of apertures provided in an aperture member, in a data generator;

performing a logical addition operation of the gradation data of the respective positions of the coordinates, in an calculator; and controlling the aperture member based on the gradation data and a result of the logical addition operation.

9. The method of claim 8 further comprising:

transferring the gradation data of ones of the bits where a result of the logical addition operation is not 0 (zero) to a controller configured to control the aperture member, and controlling the aperture member.

10. The method of claim 8, wherein the logical addition operation comprises:

specifying a kth ($1 \le k \le n$) bit not having data of 0 (zero) and being a most significant bit in the gradation data of each of the positions of the coordinates, in a calculator, and performing the logical addition operation of the kth bit and lower-order bits out of the gradation data.

11. The method of claim 8, comprising omitting transfer of a kth ($1 \le k \le n$) bit of the gradation data to a controller configured to control the aperture member when a result of the logical addition operation of the kth bit indicates that the charged particle beams are shielded in the apertures.

12. The method of claim 8, comprising omitting control of the aperture member in accordance with a kth ($1 \le k \le n$) bit of the gradation data when a result of the logical addition operation of the kth bit indicates that the charged particle beams are shielded in the apertures.

* * * * *